United States Patent
Park

(10) Patent No.: US 8,860,470 B1
(45) Date of Patent: Oct. 14, 2014

(54) INPUT/OUTPUT LINE DRIVER CIRCUIT

(71) Applicant: SK hynix Inc., Icheon-si (KR)

(72) Inventor: Nak Kyu Park, Icheon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/053,699

(22) Filed: Oct. 15, 2013

(30) Foreign Application Priority Data

Apr. 15, 2013 (KR) .................. 10-2013-0041195

(51) Int. Cl.
*H03B 1/00* (2006.01)
*H03K 17/16* (2006.01)

(52) U.S. Cl.
CPC .................................. *H03K 17/162* (2013.01)
USPC ........... 327/108; 327/112; 327/310; 327/387; 326/26

(58) Field of Classification Search
CPC combination set(s) only.
See application file for complete search history.

(56) References Cited

U.S. PATENT DOCUMENTS

| | | | |
|---|---|---|---|
| 5,311,076 A * | 5/1994 | Park et al. | 326/21 |
| 6,870,416 B2 * | 3/2005 | Cho | 327/299 |
| 2008/0088555 A1 * | 4/2008 | Shin et al. | 345/87 |
| 2008/0315915 A1 | 12/2008 | Suenaga | |

FOREIGN PATENT DOCUMENTS

KR 1020120054232 A 5/2012

* cited by examiner

*Primary Examiner* — An Luu
(74) *Attorney, Agent, or Firm* — William Park & Associates Patent Ltd.

(57) ABSTRACT

Input/output (I/O) line driving circuits are provided. The circuit includes a first I/O line driver and a second I/O line driver. The first I/O line driver receives a first input signal in response to an enable signal to generate a first control signal and drives a first I/O line in response to a second control signal. The second I/O line driver receives a second input signal in response to the enable signal to generate the second control signal and drives a second I/O line in response to the first control signal.

22 Claims, 13 Drawing Sheets

FIG.4A

| GIO_DRV1 | GIO_DRV2 |
|---|---|
| IN1='H' → PU1='L' | IN2='H' → PU2='L' |
| IN1B='L' → PD1='L' | IN2B='L' → PD2='L' |
| CNT2='H' → P13 OFF | CNT1='H' → P23 OFF |
| P11 | P21 |

FIG.4B

| GIO_DRV1 | GIO_DRV2 |
|---|---|
| IN1='H' → PU1='L' | IN2='L' → PU2='H' |
| IN1B='L' → PD1='L' | IN2B='H' → PD2='H' |
| CNT2='L' → P13 ON | CNT1='H' → N23 ON |
| P11, P12 | N21, N22 |

FIG.4C

| GIO_DRV1 | GIO_DRV2 |
|---|---|
| IN1='L' → PU1='H' | IN2='H' → PU2='L' |
| IN1B='H' → PD1='H' | IN2B='L' → PD2='L' |
| CNT2='H' → N13 ON | CNT1='L' → P23 ON |
| N11, N12 | P21, P22 |

FIG.4D

| GIO_DRV1 | GIO_DRV2 |
|---|---|
| IN1='L' →PU1='H' | IN2='L' →PU2='H' |
| IN1B='H'→ PD1='H' | IN2B='H'→ PD2='H' |
| CNT2='L' → N13 OFF | CNT1='L' → N23 OFF |
| N11 | N21 |

FIG.7A

| GIO_DRV1 | GIO_DRV2 |
|---|---|
| IN1='H' → PU3='L' | IN2='H' → PU4='L' |
| IN1B='L' → PD3='L' | IN2B='L' → PD4='L' |
| CNT4='H' → P16 OFF | CNT3='H' → P26 OFF |
| P14 | P24 |

FIG.7B

| GIO_DRV1 | GIO_DRV2 |
|---|---|
| IN1='H' → PU3='L' | IN2='L' → PU4='H' |
| IN1B='L' → PD3='L' | IN2B='H' → PD4='H' |
| CNT4='L' → P16 ON | CNT3='H' → N26 ON |
| P14, P15 | N24, N25 |

FIG.7C

| GIO_DRV1 | GIO_DRV2 |
|---|---|
| IN1='L' →PU3='H' | IN2='H' → PU4='L' |
| IN1B='H'→ PD3='H' | IN2B='L'→ PD4='L' |
| CNT4='H'→ N16 ON | CNT3='L'→ P26 ON |
| N14, N15 | P24, P25 |

FIG.7D

| GIO_DRV1 | GIO_DRV2 |
|---|---|
| IN1='L' →PU3='H' | IN2='L' →PU4='H' |
| IN1B='H'→ PD3='H' | IN2B='H'→ PD4='H' |
| CNT4='L' →N16 OFF | CNT3='L' →N26 OFF |
| N14 | N24 |

INPUT/OUTPUT LINE DRIVER CIRCUIT

CROSS-REFERENCE TO RELATED APPLICATION

The present application claims priority under 35 U.S.C 119(a) to Korean Application No. 10-2013-0041195, filed on Apr. 15, 2013, in the Korean Intellectual Property Office, which is incorporated herein by reference in its entirety.

BACKGROUND

Simultaneous switching noises (SSN) are typically generated due to inductive components of conductive lines (e.g., interconnection lines) included in electronic circuits when the electronic circuits operate with high frequency signals. These simultaneous switching noises are subject to Faraday's law of induction. According to Faraday's law of induction, a counter electromotive force (e.g., a voltage drop) may be generated between both ends of a conductive line (e.g., a conductive coil) when an alternating current (e.g., an instantaneous current) flows through the conductive line to change a magnetic field around the conductive line. In such a case, the counter electromotive force may increase as the amount of the instantaneous current, the variation rate of the instantaneous current, or the inductance of the conductive line increases. The counter electromotive force generated by the instantaneous current may cause a voltage fluctuation of a power line and/or a ground line of an electronic circuit including the conductive line, and the voltage fluctuation may generate noises which are referred to as the simultaneous switching noises. The counter electromotive force (Vnoise) may be expressed by the following equation.

$$Vnoise = -L(di/dt)$$

where, "L" denotes an inductance value of the conductive line.

Accordingly, if a number of circuit elements are simultaneously switched on/off, instantaneous changes in current across the power line and the ground line may occur. As a result, inductive voltage drops may occur to increase the simultaneous switching noises in the electronic circuits, for example, semiconductor systems. The simultaneous switching noises may cause signal delays to degrade the reliability of the semiconductor systems.

Each of the semiconductor systems may include various internal circuits, and each of the internal circuits may be configured to include a number of MOS transistors. The MOS transistors may be used as switches to operate the internal circuits. Recently, as the semiconductor systems become more highly integrated, a number of signals and data may be simultaneously transmitted through a number of signal lines or a number of input/output (I/O) lines. If a number of signals and data are simultaneously transmitted, a number of MOS transistors may also be simultaneously switched on/off to cause a number of simultaneous switching noises.

SUMMARY

Various embodiments are directed to I/O line driving circuits.

According to an embodiment, an I/O line driving circuit includes a first I/O line driver and a second I/O line driver. The first I/O line driver receives a first input signal in response to an enable signal to generate a first control signal and drives a first I/O line in response to a second control signal. The second I/O line driver receives a second input signal in response to the enable signal to generate the second control signal and drives a second I/O line in response to the first control signal.

According to an embodiment, an I/O line driving circuit includes a first I/O line driver configured to drive a first I/O line and a second I/O line driver configured to drive a second I/O line adjacent to the first I/O line. The first I/O line driver buffers a first input signal in response to an enable signal to generate a first pull-up signal, uses the first pull-up signal to generates a first control signal, and includes a first pull-up element and a second pull-up element that pull up a level of the first I/O line in response to the first pull-up signal. An operation that the second pull-up element pulls up the level of the first I/O line is controlled by a second control signal generated from a second input signal which is applied to the second I/O line driver to drive the second I/O line.

BRIEF DESCRIPTION OF THE DRAWINGS

Embodiments concept will become more apparent in view of the attached drawings and accompanying detailed description, in which:

FIGS. 4A to 4D are tables illustrating an operation of the first and second input/output line drivers shown in FIGS. 2 and 3;

FIGS. 7A to 7D are tables illustrating an operation of the first and second input/output line drivers shown in FIGS. 5 and 6.

DETAILED DESCRIPTION OF THE EMBODIMENTS

Example embodiments of the inventive concept will be described hereinafter with reference to the accompanying drawings. However, the example embodiments described herein are for illustrative purposes only and are not intended to limit the scope of the inventive concept.

Figure 1:
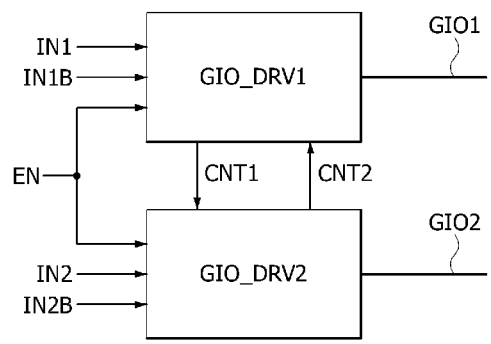
FIG. 1 is a block diagram illustrating a input/output line driving circuit according to an embodiment.

Referring to FIG. 1, an input/output (hereinafter referred to as "I/O") line driver circuit according to an embodiment may be configured to include a first I/O line driver GIO_DRV1 and a second I/O line driver GIO_DRV2. The first I/O line driver GIO_DRV1 may generate a first control signal CNT1 in response to a first input signal IN1 and an enable signal EN. In an embodiment, the first I/O line driver GIO_DRV1 may receive the first input signal IN1 in response to the enable signal EN to generate the first control signal CNT1. The first I/O line driver GIO_DRV1 may also drive a first I/O line GIO1 in response to a second control signal CNT2. The second I/O line driver GIO_DRV2 may generate the second control signal CNT2 in response to a second input signal IN2 and the enable signal EN. In an embodiment, the second I/O line driver GIO_DRV2 may receive the second input signal IN2 in response to the enable signal EN to generate the second control signal CNT2. The second I/O line driver GIO_DRV2 may also drive a second I/O line GIO2 in response to the first control signal CNT1. The first and second control signals CNT1 and CNT2 may control pull-up drive operations of the first and second I/O lines GIO1 and GIO2 when the levels of the first and second I/O lines GIO1 and GIO2 are simultaneously pulled up. Further, the first and second control signals CNT1 and CNT2 may control pull-down drive operations of the first and second I/O lines GIO1 and GIO2 when the levels of the first and second I/O lines GIO1 and GIO2 are simultaneously pulled down.

Figure 2:
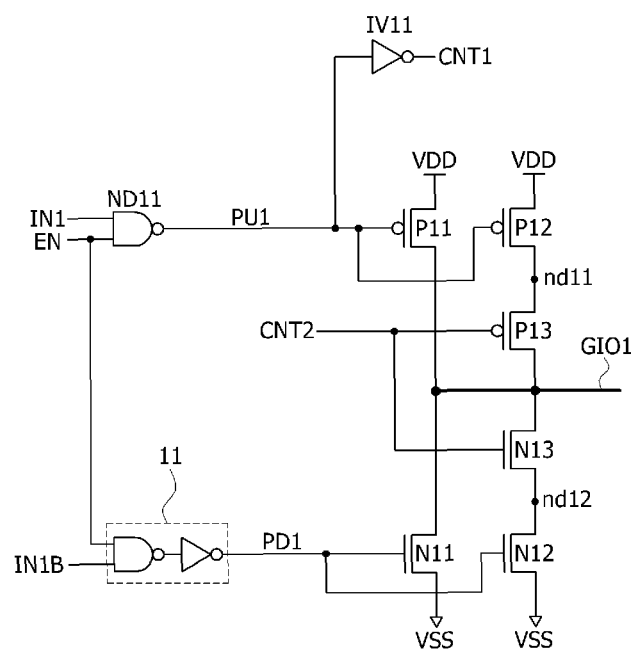
FIG. 2 is a circuit diagram illustrating an example of a first input/output line driver included in the input/output line driving circuit shown in FIG. 1.

Referring to FIG. 2, the first I/O line driver GIO_DRV1 may be configured to include a first buffer ND11, a first inversion buffer IV11, a first buffer unit 11, a first pull-up element P11, a second pull-up element P12, a first pull-up drive control element P13, a first pull-down element N11, a second pull-down element N12 and a first pull-down drive control element N13.

The first buffer ND11 may generate a first pull-up signal PU1 in response to the first input signal IN1 when an enable signal EN applied to the first buffer ND11 is enabled to have a logic "high" level. For example, the first buffer ND11 may generate the first pull-up signal PU1 by inverting the first input signal IN1. The first inversion buffer IV11 may generate the first control signal CNT1 in response to the first pull-up signal PU1. For example, the first inversion buffer IV11 may generate the first control signal CNT1 by inverting the first pull-up signal PU1. The first buffer unit 11 may generate a first pull-down signal PD1 in response to a first inverted input signal IN1B when the enable signal EN applied to the first buffer unit 11 is enabled to have a logic "high" level. For example, the first buffer unit 11 may generate the first pull-down signal PD1 by buffering the first inverted input signal IN1B. The first inverted input signal IN1B may be a complementary signal of the first input signal IN1. In an embodiment, the first pull-up element P11 may be a PMOS transistor. If the first pull-up element P11 is a PMOS transistor, a source electrode of the first pull-up element P11 may be electrically connected to a power supply terminal VDD and a drain electrode of the first pull-up element P11 may be electrically connected to the first I/O line GIO1. In such a case, if the first pull-up signal PU1 enabled to have, for example, a logic "low" level is applied to a gate electrode of the first pull-up element P11, the first pull-up element P11 may be turned on to pull up a level of the first I/O line GIO1. In an embodiment, the second pull-up element P12 may be a PMOS transistor. If the second pull-up element P12 is a PMOS transistor, a source electrode of the second pull-up element P12 may be electrically connected to the power supply terminal VDD and a drain electrode of the second pull-up element P12 may be electrically connected to a node ND11. In such a case, if the first pull-up signal PU1 enabled to have, for example, a logic "low" level is applied to a gate electrode of the second pull-up element P12, the second pull-up element P12 may be turned on to pull up a level of the node ND11. In an embodiment, the first pull-up drive control element P13 may be a PMOS transistor. If the first pull-up drive control element P13 is a PMOS transistor, a source electrode of the first pull-up drive control element P13 may be electrically connected to the node ND11 and a drain electrode of the first pull-up drive control element P13 may be electrically connected to the first I/O line GIO1. In such a case, the first pull-up drive control element P13 may control a pull-up drive operation of the second pull-up element P12 in response to the second control signal CNT2. For example, when the second control signal CNT2, having a logic "low" level, is applied to a gate electrode of the first pull-up drive control element P13 to turn on the first pull-up drive control element P13 and the first pull-up signal PU1 is enabled to have, for example, a logic "low" level, the second pull-up element P12 may be turned on to pull up a level of the first I/O line GIO1.

The first pull-down element N11 may be an NMOS transistor. In such a case, a drain electrode of the first pull-down element N11 may be electrically connected to the first I/O line GIO1 and a source electrode of the first pull-down element N11 may be electrically connected to a ground terminal VSS. Thus, when the first pull-down signal PD1 enabled to have, for example, a logic "high" level is applied to a gate electrode of the first pull-down element N11, the first pull-down element N11 may be turned on to pull down a level of the first I/O line GIO1. In an embodiment, the second pull-down element N12 may be an NMOS transistor. If the second pull-down element N12 is an NMOS transistor, a source electrode of the second pull-down element N12 may be electrically connected to the ground terminal VSS and a drain electrode of the second pull-down element N12 may be electrically connected to a node ND12. In such a case, if the first pull-down signal PD1 enabled to have, for example, a logic "high" level is applied to a gate electrode of the second pull-down element N12, the second pull-down element N12 may be turned on to pull down a level of the node ND12. In an embodiment, the first pull-down drive control element N13 may be an NMOS transistor. If the first pull-down drive control element N13 is an NMOS transistor, a source electrode of the first pull-down drive control element N13 may be electrically connected to the node ND12 and a drain electrode of the first pull-down drive control element N13 may be electrically connected to the first I/O line GIO1. In such a case, the first pull-down drive control element N13 may control a pull-down drive operation of the second pull-down element N12 in response to the second control signal CNT2. For example, when the second control signal CNT2, having a logic "high" level, is applied to a gate electrode of the first pull-down drive control element N13 to turn on the first pull-down drive control element N13 and the first pull-down signal PD1 is enabled to have, for example, a logic "high" level, the second pull-down element N12 may be turned on to pull down a level of the first I/O line GIO1.

Figure 3:
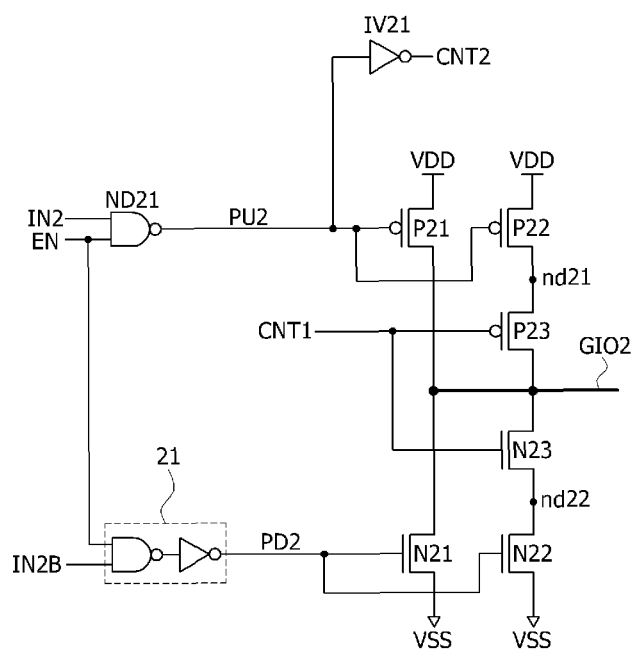
FIG. 3 is a circuit diagram illustrating an example of a second input/output line driver included in the input/output line driving circuit shown in FIG. 1.

Referring to FIG. 3, the second I/O line driver GIO_DRV2 may be configured to include a second buffer ND21, a second inversion buffer IV21, a second buffer unit 21, a third pull-up element P21, a fourth pull-up element P22, a second pull-up drive control element P23, a third pull-down element N21, a fourth pull-down element N22 and a second pull-down drive control element N23.

The second buffer ND21 may generate a second pull-up signal PU2 in response to the second input signal IN2 when an enable signal EN applied to the second buffer ND21 is enabled to have a logic "high" level. For example, the second buffer ND21 may generate the second pull-up signal PU2 by inverting the second input signal IN2. The second inversion buffer IV21 may generate the second control signal CNT2 in response the second pull-up signal PU2. For example, the second inversion buffer IV21 may generate the second control signal CNT2 by inverting the second pull-up signal PU2. The second buffer unit 21 may generate a second pull-down signal PD2 in response to a second inverted input signal IN2B when the enable signal EN applied to the second buffer unit 21 is enabled to have a logic "high" level. For example, the second buffer unit 21 may generate the second pull-down signal PD2 by buffering the second inverted input signal IN2B. The second inverted input signal IN2B may be a complementary signal of the second input signal IN2. In an embodiment, the third pull-up element P21 may be a PMOS transistor. If the third pull-up element P21 is a PMOS transistor, a source electrode of the third pull-up element P21 may be electrically connected to the power supply terminal VDD and a drain electrode of the third pull-up element P21 may be electrically connected to the second I/O line GIO2. In such a case, if the second pull-up signal PU2 enabled to have, for example, a logic "low" level is applied to a gate electrode of the third pull-up element P21, the third pull-up element P21 may be turned on to pull up a level of the second I/O line GIO2. In an embodiment, the fourth pull-up element P22 may be a PMOS transistor. If the fourth pull-up element P22 is a PMOS transistor, a source electrode of the fourth pull-up element P22 may be electrically connected to the power supply terminal VDD and a drain electrode of the fourth pull-up element P22 may be electrically connected to a node ND21. In such a case, if the second pull-up signal PU2 enabled to have, for example, a logic "low" level is applied to a gate electrode of the fourth pull-up element P22, the fourth pull-up element P22 may be turned on to pull up a level of the node ND21. In an embodiment, the second pull-up drive control element P23 may be a PMOS transistor. If the second pull-up drive control element P23 is a PMOS transistor, a source electrode of the second pull-up drive control element P23 may be electrically connected to the node ND21 and a drain electrode of the second pull-up drive control element P23 may be electrically connected to the second I/O line GIO2. In such a case, the second pull-up drive control element P23 may control a pull-up drive operation of the fourth pull-up element P22 in response to the first control signal CNT1. For example, when the first control signal CNT1, having a logic "low" level, is applied to a gate electrode of the second pull-up drive control element P23 to turn on the second pull-up drive control element P23 and the second pull-up signal PU2 is enabled to have, for example, a logic "low" level, the fourth pull-up element P22 may be turned on to pull up a level of the second I/O line GIO2.

In an embodiment, the third pull-down element N21 may be an NMOS transistor. In such a case, a drain electrode of the third pull-down element N21 may be electrically connected to the second I/O line GIO2 and a source electrode of the third pull-down element N21 may be electrically connected to the ground terminal VSS. Thus, when the second pull-down signal PD2 enabled to have, for example, a logic "high" level is applied to a gate electrode of the third pull-down element N21, the third pull-down element N21 may be turned on to pull down a level of the second I/O line GIO2. In an embodiment, the fourth pull-down element N22 may be an NMOS transistor. If the fourth pull-down element N22 is an NMOS transistor, a source electrode of the fourth pull-down element N22 may be electrically connected to the ground terminal VSS and a drain electrode of the fourth pull-down element N22 may be electrically connected to a node ND22. In such a case, if the second pull-down signal PD2 enabled to have, for example, a logic "high" level is applied to a gate electrode of the fourth pull-down element N22, the fourth pull-down element N22 may be turned on to pull down a level of the node ND22. In an embodiment, the second pull-down drive control element N23 may be an NMOS transistor. If the second pull-down drive control element N23 is an NMOS transistor, a source electrode of the second pull-down drive control element N23 may be electrically connected to the node ND22 and a drain electrode of the second pull-down drive control element N23 may be electrically connected to the second I/O line GIO2. In such a case, the second pull-down drive control element N23 may control a pull-down drive operation of the fourth pull-down element N22 in response to the first control signal CNT1. For example, when the first control signal CNT1, having a logic "high" level, is applied to a gate electrode of the second pull-down drive control element N23 to turn on the second pull-down drive control element N23 and the second pull-down signal PD2 is enabled to have, for example, a logic "high" level, the fourth pull-down element N22 may be turned on to pull down a level of the second I/O line GIO2.

Hereinafter, operations of the first and second I/O line drivers GIO_DRV1 and GIO_DRV2 shown in FIGS. 2 and 3 will be described with reference to the tables of FIGS. 4A to 4D.

Referring to FIG. 4A, if the first input signal IN1 has a logic "high" level, the first inverted input signal IN1B has a logic "low" level. Accordingly, when the enable signal EN is enabled to have a logic "high" level, the first pull-up signal PU1 may be enabled to have a logic "low" level and the first pull-down signal PD1 may be disabled to have a logic "low" level. In such a case, the first control signal CNT1 may be generated to have a logic "high" level since the first pull-up signal PU1 is enabled to have a logic "low" level. If the second input signal IN2 has a logic "high" level, the second inverted input signal IN2B has a logic "low" level. Accordingly, when the enable signal EN is enabled to have a logic "high" level, the second pull-up signal PU2 may be enabled to have a logic "low" level and the second pull-down signal PD2 may be disabled to have a logic "low" level. In such a case, the second control signal CNT2 may be generated to have a logic "high" level since the second pull-up signal PU2 is enabled to have a logic "low" level. Although both the first and second pull-up elements P11 and P12 are turned on by the first pull-up signal PU1 enabled to have a logic "low" level, the first pull-up drive control element P13 may be turned off by the second control signal CNT2 having a logic "high" level. Thus, the second pull-up element P12 cannot pull up a level of the first I/O line GIO1 of the first I/O line driver GIO_DRV1. Further, although both the third and fourth pull-up elements P21 and P22 are turned on by the second pull-up signal PU2 enabled to have a logic "low" level, the second pull-up drive control element P23 may be turned off by the first control signal CNT1 having a logic "high" level. Thus, the fourth pull-up element P22 cannot pull up a level of the second I/O line GIO2 of the second I/O line driver GIO_DRV2. That is, when both the first and second I/O lines GIO1 and GIO2 are simultaneously pulled up, the first I/O line GIO1 can be pulled up only by the first pull-up element P11 and the second I/O line GIO2 can be pulled up only by the third pull-up element P21.

Referring to FIG. 4B, if the first input signal IN1 has a logic "high" level, the first inverted input signal IN1B has a logic "low" level. Accordingly, when the enable signal EN is enabled to have a logic "high" level, the first pull-up signal PU1 may be enabled to have a logic "low" level and the first pull-down signal PD1 may be disabled to have a logic "low" level. In such a case, the first control signal CNT1 may be generated to have a logic "high" level since the first pull-up signal PU1 is enabled to have a logic "low" level. If the second input signal IN2 has a logic "low" level, the second inverted input signal IN2B has a logic "high" level. Accordingly, when the enable signal EN is enabled to have a logic "high" level, the second pull-up signal PU2 may be disabled to have a logic "high" level and the second pull-down signal PD2 may be enabled to have a logic "high" level. In such a case, the second control signal CNT2 may be generated to have a logic "low" level since the second pull-up signal PU2 is disabled to have a logic "high" level. Thus, since both the first and second pull-up elements P11 and P12 are turned on by the first pull-up signal PU1 enabled to have a logic "low" level and the first pull-up drive control element P13 is also turned on by the second control signal CNT2 having a logic "low" level, a level of the first I/O line GIO1 of the first I/O line driver GIO_DRV1 may be pulled up by the first and second pull-up elements P11 and P12. Further, since both the third and fourth pull-down elements N21 and N22 are turned on by the second pull-down signal PD2 enabled to have a logic "high" level and the second pull-down drive control element N23 is also turned on by the first control signal CNT1 having a logic "high" level, a level of the second I/O line GIO2 of the second I/O line driver GIO_DRV2 may be pulled down by the third and fourth pull-down elements N21 and N22.

Referring to FIG. 4C, if the first input signal IN1 has a logic "low" level, the first inverted input signal IN1B has a logic "high" level. Accordingly, when the enable signal EN is enabled to have a logic "high" level, the first pull-up signal PU1 may be disabled to have a logic "high" level and the first pull-down signal PD1 may be enabled to have a logic "high" level. In such a case, the first control signal CNT1 may be generated to have a logic "low" level since the first pull-up signal PU1 is disabled to have a logic "high" level. If the second input signal IN2 has a logic "high" level, the second inverted input signal IN2B has a logic "low" level. Accordingly, when the enable signal EN is enabled to have a logic "high" level, the second pull-up signal PU2 may be enabled to have a logic "low" level and the second pull-down signal PD2 may be disabled to have a logic "low" level. In such a case, the second control signal CNT2 may be generated to have a logic "high" level since the second pull-up signal PU2 is enabled to have a logic "low" level. Thus, since both the first and second pull-down elements N11 and N12 are turned on by the first pull-down signal PD1 enabled to have a logic "high" level and the first pull-down drive control element N13 is also turned on by the second control signal CNT2 having a logic "high" level, a level of the first I/O line GIO1 of the first I/O line driver GIO_DRV1 may be pulled down by the first and second pull-down elements N11 and N12. Further, since both the third and fourth pull-up elements P21 and P22 are turned on by the second pull-up signal PU2 enabled to have a logic "low" level and the second pull-up drive control element P23 is also turned on by the first control signal CNT1 having a logic "low" level, a level of the second I/O line GIO2 of the second I/O line driver GIO_DRV2 may be pulled up by the third and fourth pull-up elements P21 and P22.

Referring to FIG. 4D, if the first input signal IN1 has a logic "low" level, the first inverted input signal IN1B has a logic "high" level. Accordingly, when the enable signal EN is enabled to have a logic "high" level, the first pull-up signal PU1 may be disabled to have a logic "high" level and the first pull-down signal PD1 may be enabled to have a logic "high" level. In such a case, the first control signal CNT1 may be generated to have a logic "low" level since the first pull-up signal PU1 is disabled to have a logic "high" level. If the second input signal IN2 has a logic "low" level, the second inverted input signal IN2B has a logic "high" level. Accordingly, when the enable signal EN is enabled to have a logic "high" level, the second pull-up signal PU2 may be disabled to have a logic "high" level and the second pull-down signal PD2 may be enabled to have a logic "high" level. In such a case, the second control signal CNT2 may be generated to have a logic "low" level since the second pull-up signal PU2 is disabled to have a logic "high" level. Although both the first and second pull-down elements N11 and N12 are turned on by the first pull-down signal PD1 enabled to have a logic "high" level, the first pull-down drive control element N13 may be turned off by the second control signal CNT2 having a logic "low" level. Thus, the second pull-down element N12 cannot pull down a level of the first I/O line GIO1 of the first I/O line driver GIO_DRV1. Further, although both the third and fourth pull-down elements N21 and N22 are turned on by the second pull-down signal PD2 enabled to have a logic "high" level, the second pull-down drive control element N23 may be turned off by the first control signal CNT1 having a logic "low" level. Thus, the fourth pull-down element N22 cannot pull down a level of the second I/O line GIO2 of the second I/O line driver GIO_DRV2. That is, when both the first and second I/O lines GIO1 and GIO2 are simultaneously pulled down, the first I/O line GIO1 can be pulled down only by the first pull-down element N11 and the second I/O line GIO2 can be pulled down only by the third pull-down element N21.

As a result, a drivability of the circuit for driving the first and second I/O lines GIO1 and GIO2 shown in FIGS. 2 and 3 may be reduced when both the first and second I/O lines GIO1 and GIO2 are simultaneously pulled up or pulled down. That is, when both the first and second I/O lines GIO1 and GIO2 are simultaneously pulled up, the first I/O line GIO1 can be pulled up only by the first pull-up element P11 and the second I/O line GIO2 can be pulled up only by the third pull-up element P21. Further, when both the first and second I/O lines GIO1 and GIO2 are simultaneously pulled down, the first I/O line GIO1 can be pulled down only by the first pull-down element N11 and the second I/O line GIO2 can be pulled down only by the third pull-down element N21. Accordingly, when both the first and second I/O lines GIO1 and GIO2 are simultaneously driven to the same level, the number of elements which are simultaneously turned on can be reduced to decrease the simultaneous switching noises. Hence, the reliability of semiconductor systems including the I/O line driving circuit according to an embodiment may be improved.

Figure 5:
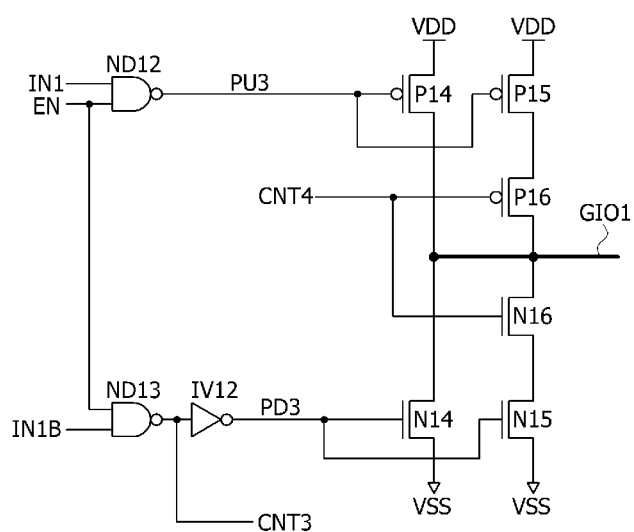
FIG. 5 is a circuit diagram illustrating another example of a first input/output line driver included in the input/output line driving circuit shown in FIG. 1.

Referring to FIG. 5, another example of the first I/O line driver GIO_DRV1 may be configured to include a third buffer ND12, a fourth buffer ND13, a third inversion buffer IV12, a fifth pull-up element P14, a sixth pull-up element P15, a third pull-up drive control element P16, a fifth pull-down element N14, a sixth pull-down element N15 and a third pull-down drive control element N16.

The third buffer ND12 may generate a third pull-up signal PU3 in response to a first input signal IN1 when an enable signal EN applied to the third buffer ND12 is enabled to have a logic "high" level. For example, the third buffer ND12 may generate the third pull-up signal PU3 by inverting the first input signal IN1. The fourth buffer ND13 may generate a third control signal CNT3 in response to a first inverted input signal IN1B when the enable signal EN applied to the fourth buffer ND13 is enabled to have a logic "high" level. For example, the fourth buffer ND13 may generate the third control signal CNT3 by inverting the first inverted input signal IN1B. The third inversion buffer IV12 may generate a third pull-down signal PD3 in response to the third control signal CNT3. For example, the third inversion buffer IV12 may generate the third pull-down signal PD3 by buffering the third control signal CNT3. The fifth pull-up element P14 may be a PMOS transistor. If the fifth pull-up element P14 is a PMOS transistor, a source electrode of the fifth pull-up element P14 may be electrically connected to the power supply terminal VDD and a drain electrode of the fifth pull-up element P14 may be electrically connected to the first I/O line GIO1. In such a case, if the third pull-up signal PU3 enabled to have, for example, a logic "low" level is applied to a gate electrode of the fifth pull-up element P14, the fifth pull-up element P14 may be turned on to pull up a level of the first I/O line GIO1. In an embodiment, the sixth pull-up element P15 and the third pull-up drive control element P16 may be PMOS transistors. If the sixth pull-up element P15 and the third pull-up drive control element P16 are PMOS transistors, the sixth pull-up element P15 and the third pull-up drive control element P16 may be connected in series. Further, a source electrode of the sixth pull-up element P15 may be electrically connected to the power supply terminal VDD and a drain electrode of the third pull-up drive control element P16 may be electrically connected to the first I/O line GIO1. In such a case, if the third pull-up signal PU3 enabled to have, for example, a logic "low" level is applied to a gate electrode of the sixth pull-up element P15, the sixth pull-up element P15 may be turned on to pull up a level of a source electrode of the third pull-up drive control element P16. In addition, the third pull-up drive control element P16 may control a pull-up drive operation of the sixth pull-up element P15 in response to a fourth control signal CNT4. For example, when the fourth control signal CNT4 having a logic "low" level is applied to a gate electrode of the third pull-up drive control element P16 to turn on the third pull-up drive control element P16 and the third pull-up signal PU3 is enabled to have a logic "low" level, the sixth pull-up element P15 may be turned on to pull up a level of the first I/O line GIO1.

The fifth pull-down element N14 may be an NMOS transistor. In such a case, a drain electrode of the fifth pull-down element N14 may be electrically connected to the first I/O line GIO1 and a source electrode of the fifth pull-down element N14 may be electrically connected to the ground terminal VSS. Thus, when the third pull-down signal PD3 enabled to have, for example, a logic "high" level is applied to a gate electrode of the fifth pull-down element N14, the fifth pull-down element N14 may be turned on to pull down a level of the first I/O line GIO1. In an embodiment, the sixth pull-down element N15 and the third pull-down drive control element N16 may be NMOS transistors. If the sixth pull-down element N15 and the third pull-down drive control element N16 are NMOS transistors, the sixth pull-down element N15 and the third pull-down drive control element N16 may be connected in series. Further, a source electrode of the sixth pull-down element N15 may be electrically connected to the ground terminal VSS and a drain electrode of the sixth pull-down drive control element N16 may be electrically connected to the first I/O line GIO1. In such a case, if the third pull-down signal PD3 enabled to have, for example, a logic "high" level is applied to a gate electrode of the sixth pull-down element N15, the sixth pull-down element N15 may be turned on to pull down a level of a source electrode of the third pull-down drive control element N16. In addition, the third pull-down drive control element N16 may control a pull-down drive operation of the sixth pull-down element N15 in response to the fourth control signal CNT4. For example, when the fourth control signal CNT4 having a logic "high" level is applied to a gate electrode of the third pull-down drive control element N16 to turn on the third pull-down drive control element N16 and the third pull-down signal PD3 is enabled to have a logic "high" level, the sixth pull-down element N15 may be turned on to pull down a level of the first I/O line GIO1.

Figure 6:
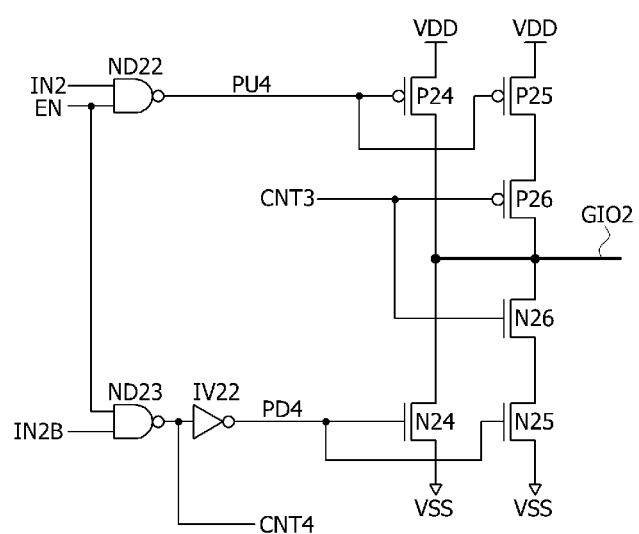
FIG. 6 is a circuit diagram illustrating another example of a second input/output line driver included in the input/output line driving circuit shown in FIG. 1.

Referring to FIG. 6, another example of the second I/O line driver GIO_DRV2 may be configured to include a fifth buffer ND22, a sixth buffer ND23, a fourth inversion buffer IV22, a seventh pull-up element P24, an eighth pull-up element P25, a fourth pull-up drive control element P26, a seventh pull-down element N24, an eighth pull-down element N25 and a fourth pull-down drive control element N26.

The fifth buffer ND22 may generate a fourth pull-up signal PU4 in response to a second input signal IN2 when an enable signal EN is enabled to have a logic "high" level. For example, the fifth buffer ND22 may generate the fourth pull-up signal PU4 by inverting the second input signal IN2. The sixth buffer ND23 may generate the fourth control signal CNT4 in response to the second inverted input signal IN2B when the enable signal EN applied to the sixth buffer ND23 is enabled to have a logic "high" level. For example, the sixth buffer ND23 may generate the fourth control signal CNT4 by inverting the second inverted input signal IN2B. The fourth inversion buffer IV22 may generate a fourth pull-down signal PD4 in response to the fourth control signal CNT4. For example, the fourth inversion buffer IV22 may generate the fourth pull-down signal PD4 by inverting the fourth control signal CNT4. In an embodiment, the seventh pull-up element P24 may be a PMOS transistor. If the seventh pull-up element P24 is a PMOS transistor, a source electrode of the seventh pull-up element P24 may be electrically connected to the power supply terminal VDD and a drain electrode of the seventh pull-up element P24 may be electrically connected to the second I/O line GIO2. In such a case, if the fourth pull-up signal PU4 enabled to have, for example, a logic "low" level is applied to a gate electrode of the seventh pull-up element P24, the seventh pull-up element P24 may be turned on to pull up a level of the second I/O line GIO2. In an embodiment, the eighth pull-up element P25 and the fourth pull-up drive control element P26 may be PMOS transistors. If the eighth pull-up element P25 and the fourth pull-up drive control element P26 are PMOS transistors, the eighth pull-up element P25 and the fourth pull-up drive control element P26 may be connected in series. Further, a source electrode of the eighth pull-up element P25 may be electrically connected to the power supply terminal VDD and a drain electrode of the fourth pull-up drive control element P26 may be electrically connected to the second I/O line GIO2. In such a case, if the fourth pull-up signal PU4 enabled to have, for example, a logic "low" level is applied to a gate electrode of the eighth pull-up element P25, the eighth pull-up element P25 may be turned on to pull up a level of a source electrode of the fourth pull-up drive control element P26. In addition, the fourth pull-up drive control element P26 may control a pull-up drive operation of the eighth pull-up element P25 in response to the third control signal CNT3. For example, when the third control signal CNT3 having a logic "low" level is applied to a gate electrode of the fourth pull-up drive control element P26 to turn on the fourth pull-up drive control element P26 and the fourth pull-up signal PU4 is enabled to have a logic "low" level, the eighth pull-up element P25 may be turned on to pull up a level of the second I/O line GIO2.

In an embodiment, the seventh pull-down element N24 may be an NMOS transistor. In such a case, a drain electrode of the seventh pull-down element N24 may be electrically connected to the second I/O line GIO2 and a source electrode of the seventh pull-down element N24 may be electrically connected to the ground terminal VSS. Thus, when the fourth pull-down signal PD4 enabled to have, for example, a logic "high" level is applied to a gate electrode of the seventh pull-down element N24, the seventh pull-down element N24 may be turned on to pull down a level of the second I/O line GIO2. In an embodiment, the eighth pull-down element N25 and the fourth pull-down drive control element N26 may be NMOS transistors. If the eighth pull-down element N25 and the fourth pull-down drive control element N26 are NMOS transistors, the eighth pull-down element N25 and the fourth pull-down drive control element N26 may be connected in series. Further, a source electrode of the eighth pull-down element N25 may be electrically connected to the ground terminal VSS and a drain electrode of the fourth pull-down drive control element N26 may be electrically connected to the second I/O line GIO2. In such a case, if the fourth pull-down signal PD4 enabled to have, for example, a logic "high" level is applied to a gate electrode of the eighth pull-down element N25, the eighth pull-down element N25 may be turned on to pull down a level of a source electrode of the fourth pull-down drive control element N26. In addition, the fourth pull-down drive control element N26 may control a pull-down drive operation of the eighth pull-down element N25 in response to the third control signal CNT3. For example, when the third control signal CNT3 having a logic "high" level is applied to a gate electrode of the fourth pull-down drive control element N26 to turn on the fourth pull-down drive control element N26 and the fourth pull-down signal PD4 is enabled to have a logic "high" level, the eighth pull-down element N25 may be turned on to pull down a level of the second I/O line GIO2.

Hereinafter, operations of the first and second I/O line drivers GIO_DRV1 and GIO_DRV2 shown in FIGS. 5 and 6 will be described with reference to the tables of FIGS. 7A to 7D.

Referring to FIG. 7A, if the first input signal IN1 has a logic "high" level, the first inverted input signal IN1B has a logic "low" level. Accordingly, when the enable signal EN is enabled to have a logic "high" level, the third pull-up signal PU3 may be enabled to have a logic "low" level and the third control signal CNT3 may be generated to have a logic "high" level since the first inverted input signal IN1B has a logic "low" level. The third pull-down signal PD3 may be disabled to have a logic "low" level since the third control signal CNT3 has a logic "high" level. If the second input signal IN2 has a logic "high" level, the second inverted input signal IN2B has a logic "low" level. Accordingly, when the enable signal EN is enabled to have a logic "high" level, the fourth pull-up signal PU4 may be enabled to have a logic "low" level and the fourth control signal CNT4 may be generated to have a logic "high" level in response to the second inverted input signal IN2B having a logic "low" level. The fourth pull-down signal PD4 may be disabled to have a logic "low" level since the fourth control signal CNT4 has a logic "high" level. Although both the fifth and sixth pull-up elements P14 and P15 are turned on by the third pull-up signal PU3 enabled to have a logic "low" level, the third pull-up drive control element P16 may be turned off by the fourth control signal CNT4 having a logic "high" level. Thus, the sixth pull-up element P15 cannot pull up a level of the first I/O line GIO1 of the first I/O line driver GIO_DRV1. Further, although both the seventh and eighth pull-up elements P24 and P25 are turned on by the fourth pull-up signal PU4 enabled to have a logic "low" level, the fourth pull-up drive control element P26 may be turned off by the third control signal CNT3 having a logic "high" level. Thus, the eighth pull-up element P25 cannot pull up a level of the second I/O line GIO2 of the second I/O line driver GIO_DRV2. That is, when both the first and second I/O lines GIO1 and GIO2 are simultaneously pulled up, the first I/O line GIO1 can be pulled up only by the fifth pull-up element P14 and the second I/O line GIO2 can be pulled up only by the seventh pull-up element P24.

Referring to FIG. 7B, if the first input signal IN1 has a logic "high" level, the first inverted input signal IN1B has a logic "low" level. Accordingly, when the enable signal EN is enabled to have a logic "high" level, the third pull-up signal PU3 may be enabled to have a logic "low" level and the third control signal CNT3 may be generated to have a logic "high" level since the first inverted input signal IN1B has a logic "low" level. The third pull-down signal PD3 may be disabled to have a logic "low" level since the third control signal CNT3 has a logic "high" level. If the second input signal IN2 has a logic "low" level, the second inverted input signal IN2B has a logic "high" level. Accordingly, when the enable signal EN is enabled to have a logic "high" level, the fourth pull-up signal PU4 may be disabled to have a logic "high" level and the fourth control signal CNT4 may be generated to have a logic "low" level since the second inverted input signal IN2B has a logic "high" level. The fourth pull-down signal PD4 may be enabled to have a logic "high" level since the fourth control signal CNT4 has a logic "low" level. Thus, because both the fifth and sixth pull-up elements P14 and P15 are turned on by the third pull-up signal PU3 enabled to have a logic "low" level and the third pull-up drive control element P16 is also turned on by the fourth control signal CNT4 having a logic "low" level, a level of the first I/O line GIO1 of the first I/O line driver GIO_DRV1 may be pulled up by the fifth and sixth pull-up elements P14 and P15. Further, since both the seventh and eighth pull-down elements N24 and N25 are turned on by the fourth pull-down signal PD4 enabled to have a logic "high" level and the fourth pull-down drive control element N26 is also turned on by the third control signal CNT3 having a logic "high" level, a level of the second I/O line GIO2 of the second I/O line driver GIO_DRV2 may be pulled down by the seventh and eighth pull-down elements N24 and N25.

Referring to FIG. 7C, if the first input signal IN1 has a logic "low" level, the first inverted input signal IN1B has a logic "high" level. Accordingly, when the enable signal EN is enabled to have a logic "high" level, the third pull-up signal PU3 may be disabled to have a logic "high" level and the third control signal CNT3 may be generated to have a logic "low" level since the first inverted input signal IN1B has a logic "high" level. The third pull-down signal PD3 may be enabled to have a logic "high" level since the third control signal CNT3 has a logic "low" level. If the second input signal IN2 has a logic "high" level, the second inverted input signal IN2B has a logic "low" level. Accordingly, when the enable signal EN is enabled to have a logic "high" level, the fourth pull-up signal PU4 may be enabled to have a logic "low" level and the fourth control signal CNT4 may be generated to have a logic "high" level since the second inverted input signal IN2B has a logic "low" level. The fourth pull-down signal PD4 may be enabled to have a logic "low" level since the fourth control signal CNT4 has a logic "high" level. Thus, because both the fifth and sixth pull-down elements N14 and N15 are turned on by the third pull-down signal PD3 enabled to have a logic "high" level and the third pull-down drive control element N16 is also turned on by the fourth control signal CNT4 having a logic "high" level, a level of the first I/O line GIO1 of the first I/O line driver GIO_DRV1 may be pulled down by the fifth and sixth pull-down elements N14 and N15. Further, since both the seventh and eighth pull-up elements P24 and P25 are turned on by the fourth pull-up signal PU4 enabled to have a logic "low" level and the fourth pull-up drive control element P26 is also turned on by the third control signal CNT3 having a logic "low" level, a level of the second I/O line GIO2 of the second I/O line driver GIO_DRV2 may be pulled up by the seventh and eighth pull-up elements P24 and P25.

Referring to FIG. 7D, if the first input signal IN1 has a logic "low" level, the first inverted input signal IN1B has a logic "high" level. Accordingly, when the enable signal EN is enabled to have a logic "high" level, the third pull-up signal PU3 may be disabled to have a logic "high" level and the third control signal CNT3 may be generated to have a logic "low" level since the first inverted input signal IN1B has a logic "high" level. The third pull-down signal PD3 may be enabled to have a logic "high" level since the third control signal CNT3 has a logic "low" level. If the second input signal IN2 has a logic "low" level, the second inverted input signal IN2B has a logic "high" level. Accordingly, when the enable signal EN is enabled to have a logic "high" level, the fourth pull-up signal PU4 may be disabled to have a logic "high" level and the fourth control signal CNT4 may be generated to have a logic "low" level since the second inverted input signal IN2B having a logic "high" level. The fourth pull-down signal PD4 may be enabled to have a logic "high" level since the fourth control signal CNT4 has a logic "low" level. Although both the fifth and sixth pull-down elements N14 and N15 are turned on by the third pull-down signal PD3 enabled to have a logic "high" level, the third pull-down drive control element N16 may be turned off by the fourth control signal CNT4 having a logic "low" level. Thus, the sixth pull-down element N15 cannot pull down a level of the first I/O line GIO1 of the first I/O line driver GIO_DRV1. Further, although both the seventh and eighth pull-down elements N24 and N25 are turned on by the fourth pull-down signal PD4 enabled to have a logic "high" level, the fourth pull-down drive control element N26 may be turned off by the third control signal CNT3 having a logic "low" level. Thus, the eighth pull-down element N25 cannot pull down a level of the second I/O line GIO2 of the second I/O line driver GIO_DRV2. That is, when both the first and second I/O lines GIO1 and GIO2 are simultaneously pulled down, the first I/O line GIO1 can be pulled down only by the fifth pull-down element N14 and the second I/O line GIO2 can be pulled down only by the seventh pull-down element N24.

As a result, a drivability of the circuit for driving the first and second I/O lines GIO1 and GIO2 shown in FIGS. 5 and 6 may be reduced when both the first and second I/O lines GIO1 and GIO2 are simultaneously pulled up or pulled down. That is, when both the first and second I/O lines GIO1 and GIO2 are simultaneously pulled up, the first I/O line GIO1 can be pulled up only by the fifth pull-up element P14 and the second I/O line GIO2 can be pulled up only by the seventh pull-up element P24. Further, when both the first and second I/O lines GIO1 and GIO2 are simultaneously pulled down, the first I/O line GIO1 can be pulled down only by the fifth pull-down element N14 and the second I/O line GIO2 can be pulled down only by the seventh pull-down element N24. Accordingly, when both the first and second I/O lines GIO1 and GIO2 are simultaneously driven to the same level, the number of elements which are simultaneously turned on can be reduced to decrease the simultaneous switching noises. Hence, the reliability of semiconductor systems including the I/O line driving circuit according to an embodiment may be improved.

The example embodiments of the inventive concept have been disclosed above for illustrative purposes. Those skilled in the art will appreciate that various modifications, additions and substitutions are possible, without departing from the scope and spirit of the inventive concept as disclosed in the accompanying claims.

What is claimed is:

1. An input/output line driver circuit comprising:
    a first I/O line driver configured to generate a first control signal in response to a first input signal and an enable signal and configured to drive a first I/O line in response to a second control signal; and
    a second I/O line driver configured to generate the second control signal in response to a second input signal and the enable signal and configured to drive a second I/O line in response to the first control signal.

2. The input/output line driver circuit of claim 1:
    wherein the first I/O line driver is configured to receive the first input signal in response to the enable signal;
    wherein the second I/O line driver is configured to receive the second input signal in response to the enable signal;
    wherein the first I/O line driver includes a first pull-up element and a second pull-up element that pull up a level of the first I/O line in response to a first pull-up signal; and
    wherein the second control signal controls an operation that the second pull-up element pulls up the level of the first I/O line.

3. The input/output line driver circuit of claim 2, wherein the second control signal prevents the second pull-up element from pulling up the level of the first I/O line when both the first and second input signals have a first logic level.

4. The input/output line driver circuit of claim 2, wherein the first pull-up signal is generated by inverting the first input signal when the enable signal is enabled.

5. The input/output line driver circuit of claim 2:
    wherein the second I/O line driver includes a third pull-up element and a fourth pull-up element configured to pull up a level of the second I/O line in response to a second pull-up signal; and
    wherein the first control signal controls an operation that the fourth pull-up element pulls up the level of the second I/O line.

6. The input/output line driver circuit of claim 5, wherein the first control signal prevents the fourth pull-up element from pulling up the level of the second I/O line when both the first and second input signals have a first logic level.

7. The input/output line driver circuit of claim 5, wherein the second pull-up signal is generated by inverting the second input signal when the enable signal is enabled.

8. The input/output line driver circuit of claim 1:
    wherein the first I/O line driver includes a first pull-down element and a second pull-down element configured to pull down a level of the first I/O line in response to a first pull-down signal; and
    wherein the second control signal controls an operation that the second pull-down element pulls down the level of the first I/O line.

9. The input/output line driver circuit of claim 8, wherein the second control signal prevents the second pull-down element from pulling down the level of the first I/O line when both the first and second input signals have a second logic level.

10. The input/output line driver circuit of claim 8, wherein the first pull-down signal is generated by buffering a complementary signal of the first input signal when the enable signal is enabled.

11. The input/output line driver circuit of claim 8:
    wherein the second I/O line driver includes a third pull-down element and a fourth pull-down element configured to pull down a level of the second I/O line in response to a second pull-down signal; and
    wherein the first control signal controls an operation that the fourth pull-down element pulls down the level of the second I/O line.

12. The input/output line driver circuit of claim 11, wherein the first control signal prevents the fourth pull-down element from pulling down the level of the second I/O line when both the first and second input signals have a second logic level.

13. The input/output line driver circuit of claim 11, wherein the second pull-down signal is generated by buffering a complementary signal of the second input signal when the enable signal is enabled.

14. The input/output line driver circuit of claim 1, wherein the first I/O line driver includes:

a first pull-up element configured to pull up a level of the first I/O line in response to a first pull-up signal generated from the first input signal when the enable signal is enabled;

a second pull-up element configured to pull up the level of the first I/O line in response to the first pull-up signal; and a first pull-up drive control element configured to have one electrode connected to the second pull-up element and another electrode connected to the first I/O line, wherein the first pull-up drive control element is turned on in response to the second control signal.

15. The input/output line driver circuit of claim 14, wherein the first I/O line driver further includes:

a first pull-down element configured to pull down a level of the first I/O line in response to a first pull-down signal generated from the first input signal when the enable signal is enabled;

a second pull-down element configured to pull down the level of the first I/O line in response to the first pull-down signal; and a first pull-down drive control element configured to have one electrode connected to the second pull-down element and another electrode connected to the first I/O line, wherein the first pull-down drive control element is turned on in response to the second control signal.

16. The input/output line driver circuit of claim 15, wherein the second I/O line driver includes:

a third pull-up element configured to pull up a level of the second I/O line in response to a second pull-up signal generated from the first input signal when the enable signal is enabled;

a fourth pull-up element configured to pull up the level of the second I/O line in response to the second pull-up signal; and a second pull-up drive control element configured to have one electrode connected to the fourth pull-up element and another electrode connected to the second I/O line, wherein the second pull-up drive control element is turned on in response to the first control signal.

17. The input/output line driver circuit of claim 16, wherein the second I/O line driver further includes:

a third pull-down element configured to pull down a level of the second I/O line in response to a second pull-down signal generated from the second input signal when the enable signal is enabled;

a fourth pull-down element configured to pull down the level of the second I/O line in response to the second pull-down signal; and a second pull-down drive control element configured to have one electrode connected to the fourth pull-down element and another electrode connected to the second I/O line, wherein the second pull-down drive control element is turned on in response to the first control signal.

18. An input/output line driver comprising:

a first I/O line driver configured to drive a first I/O line; and a second I/O line driver configured to drive a second I/O line adjacent to the first I/O line, wherein the first I/O line driver buffers a first input signal in response to an enable signal to generate a first pull-up signal, uses the first pull-up signal to generates a first control signal, and includes a first pull-up element and a second pull-up element configured to pull up a level of the first I/O line in response to the first pull-up signal; and wherein an operation that the second pull-up element pulls up the level of the first I/O line is controlled by a second control signal generated from a second input signal which is applied to the second I/O line driver to drive the second I/O line.

19. The input/output line driver circuit of claim 18, wherein the second control signal prevents the second pull-up element from pulling up the level of the first I/O line when both the first and second input signals have a first logic level.

20. The input/output line driver circuit of claim 18:

wherein the second I/O line driver buffers the second input signal in response to the enable signal to generate a second pull-up signal, and includes a third pull-up element and a fourth pull-up element configured to pull up a level of the second I/O line in response to the second pull-up signal; and wherein the first control signal prevents the fourth pull-up element from pulling up the level of the second I/O line when both the first and second input signals have a first logic level.

21. The input/output line driver circuit of claim 18:

wherein the first I/O line driver buffers the first input signal in response to the enable signal to generate a first pull-down signal, and further includes a first pull-down element and a second pull-down element configured to pull down a level of the first I/O line in response to the first pull-down signal; and wherein the second control signal prevents the second pull-down element from pulling down the level of the first I/O line when both the first and second input signals have a second logic level.

22. The input/output line driver circuit of claim 20:

wherein the second I/O line driver further includes a third pull-down element and a fourth pull-down element that pull down a level of the second I/O line in response to a second pull-down signal; and wherein the first control signal prevents the fourth pull-down element from pulling down the level of the second I/O line when both the first and second input signals have a second logic level.

* * * * *